US009413385B2

(12) United States Patent
Mulder

(10) Patent No.: US 9,413,385 B2
(45) Date of Patent: Aug. 9, 2016

(54) EFFICIENT DECODER FOR CURRENT-STEERING DIGITAL-TO-ANALOG CONVERTER

(71) Applicant: Broadcom Corporation, Irvine, CA (US)

(72) Inventor: Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/565,172

(22) Filed: Dec. 9, 2014

(65) Prior Publication Data

US 2016/0149587 A1    May 26, 2016

Related U.S. Application Data

(60) Provisional application No. 62/083,773, filed on Nov. 24, 2014.

(51) Int. Cl.
*H03M 1/66* (2006.01)
*H03M 7/16* (2006.01)

(52) U.S. Cl.
CPC .................. *H03M 7/165* (2013.01)

(58) Field of Classification Search
CPC . H03M 13/3707; H03M 13/27; H03M 7/165; H04L 2209/08
USPC ......... 341/144, 155, 122, 133, 145, 118, 120, 341/96
See application file for complete search history.

(56) References Cited

U.S. PATENT DOCUMENTS

| | | | | |
|---|---|---|---|---|
| 6,424,283 B2* | 7/2002 | Bugeja | ......................... | 341/145 |
| 6,762,702 B2* | 7/2004 | Kwan | ................ | H03M 1/0665 341/118 |
| 6,819,276 B1* | 11/2004 | Hossack | ............ | H03M 1/0673 341/143 |
| 8,159,381 B2* | 4/2012 | Parida | .................... | H03M 7/12 341/118 |

OTHER PUBLICATIONS

Galton, Ian, "Why Dynamic-Element-Matching DACs Work", IEEE Transactions on Circuits and Systems-II: Express Briefs, vol. 57, No. 2, Feb. 2010, pp. 69-74.
Lin et al., "A 12-bit 40 nm DAC Achieving SFDR > 70 dB at 1.6 GS/s and IMD < -61dB at 2.8 GS/s with DEMDRZ Technique", IEEE Journal of Solid-State Circuits, vol. 49, No. 3, Mar. 2014, pp. 708-717.

* cited by examiner

*Primary Examiner* — Peguy Jean Pierre

(57) ABSTRACT

A decoder for a current-steering digital-to-analog converter (DAC) is described herein. In an embodiment, the decoder is a dynamic element matching (DEM) row/column decoder that randomizes pairs of row control signals and column control signals that are provided to a matrix of current cells. The randomization is performed in a manner that ensures that the pairs of row control signals are randomized as pairs. In another embodiment, the decoder is an N-dimensional decoder, where N is any integer greater than two. The N-dimensional decoder comprises an N number of decoders that are each configured to provide respective control signals that are provided to current source(s) in current cell(s) in a respective dimension of an N-dimensional matrix of current cells for enabling current source(s) included therein. Such decoders advantageously allow for a simpler, more efficient design compared to a non-segmented, unary DAC due to the smaller area and lower power consumed.

21 Claims, 13 Drawing Sheets

EFFICIENT DECODER FOR CURRENT-STEERING DIGITAL-TO-ANALOG CONVERTER

CROSS REFERENCE TO RELATED APPLICATION

This application claims priority to U.S. Provisional Application Ser. No. 62/083,773, filed Nov. 24, 2014, the entirety of which is incorporated by reference herein.

BACKGROUND

1. Technical Field

Embodiments described herein generally relate to systems and methods for converting digital signals to analog signals.

2. Description of Related Art

Real-world analog signals are routinely converted to a digital representation that can be easily processed in modern digital systems. In many systems, this digital information is converted back to an analog form to perform some real-world function. The circuits that perform this conversion are digital-to-analog converters (DACs), and their outputs are used to drive a variety of devices. Such devices include, but are not limited to, loudspeakers, video displays, motors, mechanical servos, radio frequency (RF) transmitters, and temperature controls. DACs are often incorporated into digital systems in which real-world analog signals are digitized by analog-to-digital converters (ADCs), processed, and then converted back to analog form by the DACs.

BRIEF SUMMARY

Methods, systems, and apparatuses are described for providing an efficient decoder for a current-steering DAC, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Figure 1:
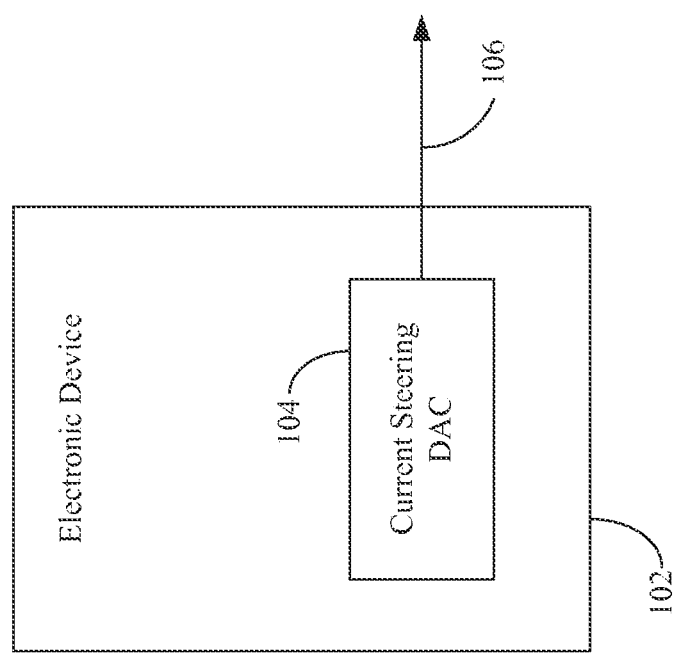
FIG. 1 depicts a block diagram of an example electronic device containing a current steering digital-to-analog converter (DAC), according to an example embodiment.

The features and advantages of the subject matter of the present application will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner.

II. Example Embodiments

In embodiments, a decoder for a current-steering DAC is described herein. In accordance with an embodiment, the decoder is a dynamic element matching (DEM) row/column decoder that randomizes pairs of particular row control signals and column control signals that are provided to a matrix of current cells. The randomization is performed in a manner that ensures that the pairs of row control signals are randomized as pairs (rather than on an individual basis). In such an embodiment, the decoder may be considered an N-dimensional decoder, where N is equal to 2 (a row decoder and a column decoder). In accordance with another embodiment, the decoder is an N-dimensional decoder, where N is an integer greater than two. The N-dimensional decoder comprises an N number of decoders that are each configured to generate respective control signals that are provided to one or more current cells in a respective dimension of an N-dimensional matrix of current cells for enabling one or more current sources included therein. The decoders described herein advantageously allow for a simpler, more efficient design compared to a non-segmented, unary DAC due to the smaller area and lower power consumed.

In particular, an apparatus is described herein that comprises a first decoder and a first randomizer coupled to the first decoder. The first decoder is configured to decode a first plurality of input data bits and generate a first plurality of decoded bits to the first randomizer. The first randomizer is configured to randomize the first plurality of decoded bits to generate a first plurality of randomized bits. The first plurality of randomized bits is provided to one or more current cells in one or more rows of a matrix of current cells.

A method is also described herein. In accordance with the method, a first plurality of input data bits is received, a first plurality of randomized bits are generated based on the first plurality of input data bits, and the first plurality of randomized bits are provided to a plurality of rows of a matrix of current cells. A second plurality of input data bits is received, a second plurality of randomized bits is generated based on the second plurality of input data bits, and the second plurality of randomized bits is provided to a plurality of columns of the matrix of current cells. The first plurality of randomized bits and the second plurality of randomized bits are configured to enable one or more current sources in the matrix of current cells.

Another apparatus is further described herein. The apparatus includes a first decoder, a second decoder, and a third decoder. The first decoder is configured to receive a first plurality of input data bits and generate one or more first control signals that are provided to one or more current sources of a first dimension of an N-dimensional matrix of current cells, the one or more first control signals being based on the first plurality of input data bits, where N is any integer greater than two. The second decoder is configured to receive a second plurality of input data bits and generate one or more second control signals that are provided to one or more current sources of a second dimension of the N-dimensional matrix of current cells, the one or more second control signals being based on the second plurality of input data bits. The third decoder is configured to receive a third plurality of input data bits and generate one or more third control signals that are provided to one or more current sources of a third dimension of the N-dimensional matrix of current cells, the one or more third control signals being based on the third plurality of input data bits.

These example embodiments, as well as additional embodiments, are described in further detail in the following section/subsections.

III. Example Decoders for a Current-Steering DAC

FIG. 1 depicts a block diagram of an example electronic device 102 in accordance with an embodiment. Electronic device 102 may be any device that is configured to receive and/or process digital data. Electronic device 102 may also be configured to provide the data received and/or processed therein to one or more other devices over an analog transmission link 106. Accordingly, electronic device 102 may include a current-steering DAC 104 that is configured to convert the digital data to analog before providing it over analog transmission link 106.

Examples of electronic device 102 include, but are not limited to, a cellular telephone, a personal data assistant (PDA), a tablet computer, a laptop computer, a handheld computer, a desktop computer, a video game system, or any other device that processes digital data, converts the digital data to analog, and/or provides the analog data to other device(s) over analog transmission link 106.

Examples of analog transmission link 106 include, but are not limited to, wired links, such as coaxial cables, twisted-pair cables (e.g., used for communication via telephone or Ethernet, etc.), fiber-optic cables, and/or the like, and wireless links, such as wireless LAN (WLAN) links, Worldwide Interoperability for Microwave Access (Wi-MAX) links, cellular network links, wireless personal area network (PAN) links (e.g., Bluetooth™ links), and/or any other radio frequency (RF)-based communication link.

Current-steering DAC 104 includes a plurality of current sources that are selectively enabled based on the digital input data bit(s) being provided to current-steering DAC 104. The greater the value represented by the digital input data bit(s), the greater number of current sources that are enabled. The output of each of the enabled current sources may be summed, and a representative analog value is obtained from the summed currents (e.g., the summed currents are converted to a voltage), which is then provided over analog transmission link 106.

It is noted that in embodiments, current-steering DAC 104 is implemented as a differential-mode current-steering DAC. In accordance with such embodiments, each current source includes a positive output and a negative output. The current for a particular current source is steered to either a positive output or a negative output of the particular current source depending on the value of a corresponding bit of the digital input data bit(s). For example, the current may be steered to the positive output when the corresponding bit of the digital input data bit(s) is equal to a '1' (logical high signal value), and the current may be steered to the negative output when the corresponding bit of the digital input data bit(s) is equal to '0' (logical low signal value). In accordance with such embodiments, a current source is said to be enabled when the current is steered to the positive output and is said to be disabled when the current is steered to the negative output.

In accordance with one or more embodiments, current-steering DAC 104 includes dynamic element matching (DEM), which randomizes the current sources that are enabled. This advantageously causes analog component mismatches to introduce spectrally-shaped, pseudorandom noise instead of nonlinear distortion.

In accordance with one or more embodiments, current-steering DAC 104 is implemented using a segmented structure, where the decoding of the digital input data bits are segmented into different groups. For example, in an embodiment in which the decoding is segmented into two groups, the decoding is segmented into rows and columns. Embodiments described herein also provide for decoding that is segmented into more than two groups. Segmenting the decoding of current-steering DAC 104 advantageously allows for a simpler, more efficient design compared to a non-segmented, unary DAC due to the smaller area and lower power consumed.

A. DEM Row/Column Decoder for a Current-Steering DAC

Figure 2:
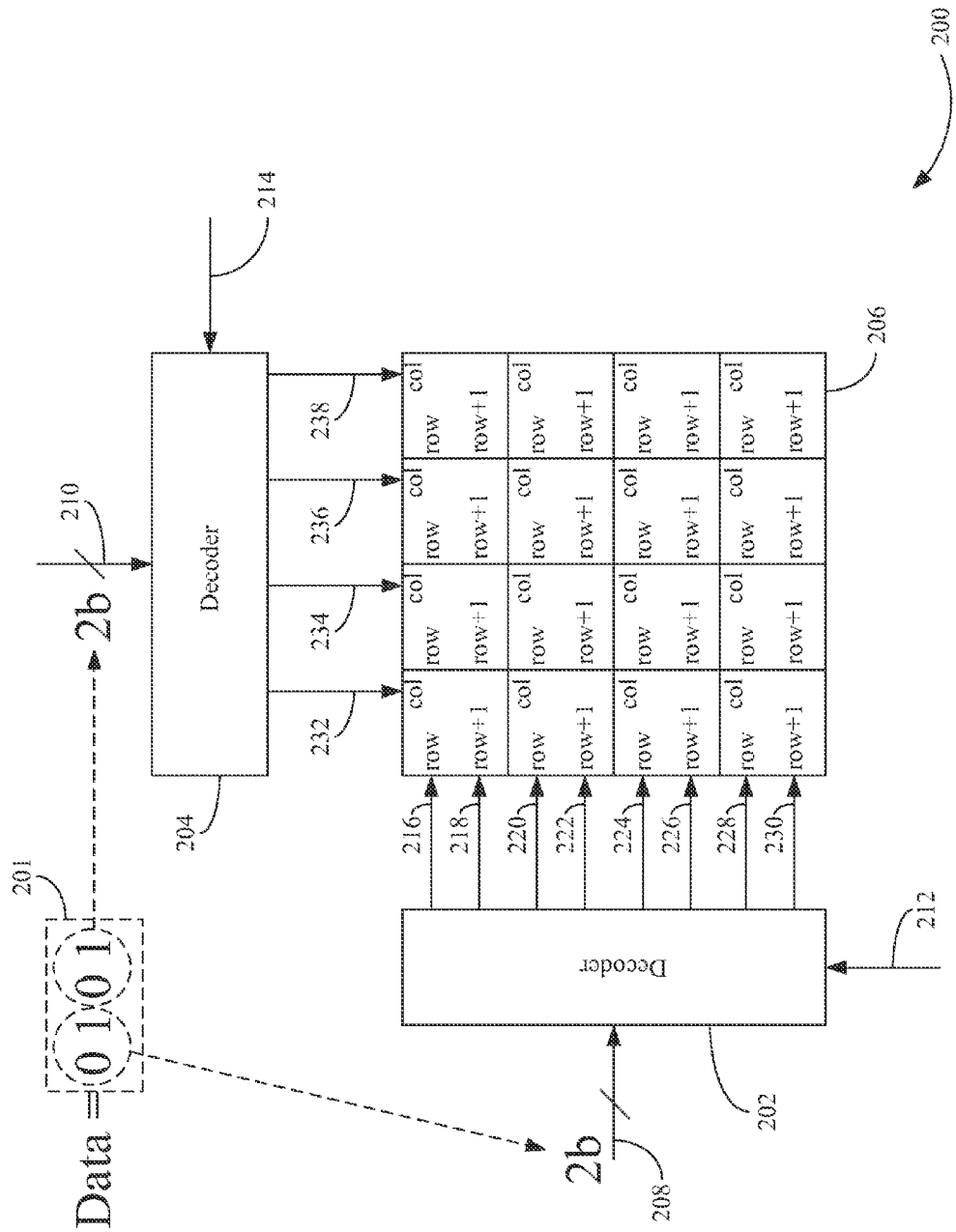
FIG. 2 depicts a block diagram of an example dynamic element matching row/column decoder for a current-steering DAC, according to an example embodiment.

FIG. 2 depicts a block diagram of an example DEM row/column decoder 200 for a current-steering DAC in accordance with an embodiment. DEM row/column decoder 200 may be included in current-steering DAC 104, as shown in FIG. 1. As shown in FIG. 2, digital input data bits 201 are segmented into a first plurality of input data bits and a second plurality of input data bits. It is noted that while FIG. 2 shows a 4-bit digital input being segmented into a first and second plurality of input data bits, any digital input bit-size may be segmented into a first and second plurality of input data bits and the usage of a 4-bit digital input is purely exemplary.

As shown in FIG. 2, DEM row/column decoder 200 includes a first decoder 202, a second decoder 204, and a matrix of current cells 206. Each current cell in matrix of current cells 206 may include a current source and/or decoding logic used to enable the current source. Each current source may be an electronic circuit that is configured to deliver an electric current. In accordance with an embodiment, current source(s) are implemented as a passive current source. For example, current source(s) may comprise a resistor coupled to a voltage source. In accordance with another embodiment, current source(s) are implemented as an active current source. For example, current source(s) may comprise one or more switches (e.g., transistors), op-amps, and/or resistors that are operatively coupled to one or more voltage sources to provide a current in a controlled fashion.

First decoder 202 is configured to receive and decode the first plurality of input data bits (received via one or more signal lines 208) in accordance to a particular decoding scheme to generate a first plurality of decoded bits. First decoder 202 is also configured to perform DEM by randomizing the first plurality of decoded bits (moving around the bit values of the decoded bits) to generate a first plurality of randomized bits. The decoded bits may be randomized based on a control signal 212 that provides a pseudorandom bit sequence that causes first decoder 202 to randomize the first plurality of decoded bits to generate the first plurality of randomized bits. In accordance with an embodiment, first decoder 202 randomizes the first plurality of decoded bits by shifting the first plurality of decoded bits by a value corresponding to the pseudorandom bit sequence. It will be recognized that other randomization schemes may be used to randomize the first plurality of decoded bits.

The first plurality of randomized bits may be provided to one or more current cells in one or more rows of matrix of current cells 206. Thus, first decoder 202 may be referred to as a row decoder. Each row of current cells in matrix of current cells 206 may be configured to receive two bits of the first plurality of randomized bits via signal lines. The first bit of the two bits may correspond to a first row control signal (referred to as a 'row' control signal), and the second bit of the two bits may correspond to a second row control signal (referred to as 'row+1' control signal). As shown in FIG. 2, the first row of current cells of matrix of current cells 206 receives a first 'row' control signal generated by first decoder 202 via a signal line 216 and receives a first 'row+1' control signal generated by first decoder 202 via a signal line 218. The second row of current cells of matrix of current cells 206 receives a second 'row' control signal generated by first decoder 202 via a signal line 220 and receives a second 'row+1' control signal generated by first decoder 202 via a signal line 222. The third row of current cells of matrix of current cells 206 receives a third 'row' control signal generated by first decoder 202 via a signal line 224 and receives a third 'row+1' control signal generated by first decoder 202 via a signal line 226. The fourth row of current cells of matrix of current cells 206 receives a fourth 'row' control signal generated by first decoder 202 via a signal line 228 and receives a fourth 'row+1' control signal generated by first decoder 202 via a signal line 230.

In accordance with an embodiment, if the 'row' control signal of a particular row is enabled (or active) (e.g., the 'row' control signal is a '1' (logical high signal value)), the current sources in that row are enabled or disabled based on whether column control signals generated by second decoder 204 are enabled or disabled (as described below). If the 'row+1' control signal of a particular row is enabled, all the current sources in that row are enabled irrespective of the 'column' control signals generated by second decoder 204.

Second decoder 204 is configured to receive and decode the second plurality of input data bits (received via signal line(s) 210) in accordance to a particular decoding scheme to generate a second plurality of decoded bits. Second decoder 204 is also configured to perform DEM by randomizing the second plurality of decoded bits to generate a second plurality of randomized bits. The decoded bits may be randomized based on a control signal 214 that provides a pseudorandom bit sequence that causes second decoder 204 to randomize the second plurality of decoded bits to generate the second plurality of randomized bits. In accordance with an embodiment, second decoder 204 randomizes the second plurality of decoded bits by shifting the second plurality of decoded bits by a value corresponding to the pseudorandom bit sequence. It will be recognized that other randomization schemes may be used to randomize the second plurality of decoded bits.

The second plurality of randomized bits may be provided to one or more columns of matrix of current cells 206 based on the second plurality of randomized bits. Thus, second decoder 206 may be referred to as a column decoder. Each column of current cells in matrix of current cells 206 may be configured to receive a single bit of the second plurality of randomized bits. The single bit may correspond to a 'column' control signal. As shown in FIG. 2, the first column of current cells of matrix of current cells 206 receives a first 'column' control signal generated by second decoder 204 via a signal line 232. The second column of current cells of matrix of current cells 206 receives a second 'column' control signal generated by second decoder 204 via a signal line 234. The third column of current cells of matrix of current cells 206 receives a third 'column' control signal generated by second decoder 204 via a signal line 236. The fourth column of current cells of matrix of current cells 206 receives a fourth 'column' control signal generated by second decoder 204 via a signal line 238.

A current source in a current cell of matrix of current cells 206 may be enabled when the 'row' control signal and the 'column' control signal received thereby are enabled. However, if a 'row+1' for a particular row is enabled, then the current sources of the particular row are enabled irrespective of the 'column' control signals.

Figure 3A:
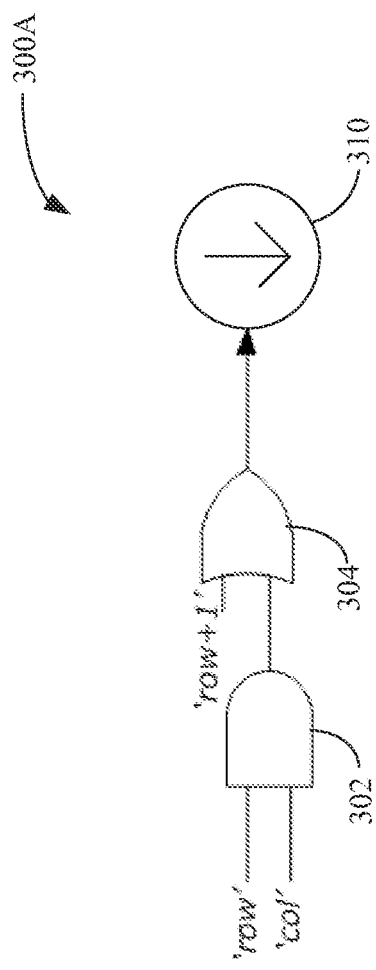
FIG. 3A shows an example of decoding logic used to enable a current source in a matrix of current cells, according to an example embodiment.
Figure 3B:
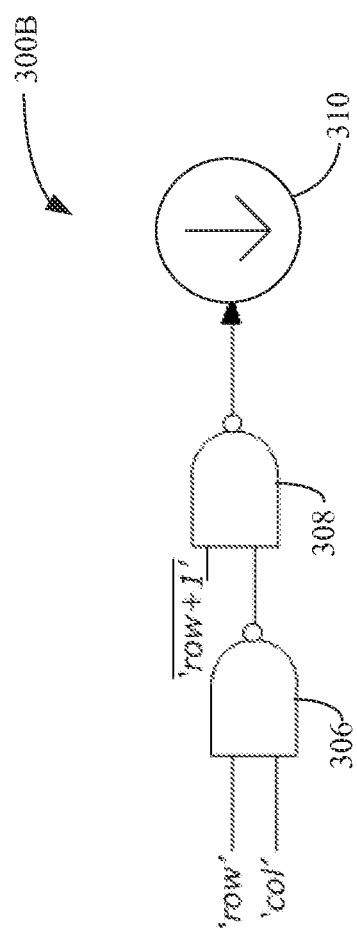
FIG. 3B shows another example of decoding logic used to enable a current source in a matrix of current cells, according to another example embodiment.

FIGS. 3A and 3B show example implementations of decoding logic that may be used to enable a current source in accordance with embodiments. FIG. 3A shows an implementation of decoding logic 300A using an AND gate 302 and an OR gate 304. FIG. 3B shows an implementation of decoding logic 300B using two NAND gates (i.e., NAND gate 306 and NAND gate 308). Decoding logic 300A or 300B may be included in each current cell of matrix of current cells 206 (as shown in FIG. 2). As shown in FIGS. 3A and 3B, a current source 310 coupled to decoding logic 300A and 300B may be enabled either when the 'row' control signal and the 'column' control signal received by decoding logic 300A and 300B are enabled, or when the 'row+1' control signal received by decoding logic 300A and 300B is enabled. It is noted that in decoding logic 300B, the complement of 'row+1' is provided to NAND gate 308, thereby causing current source 310 to be enabled when 'row+1' is enabled.

Figure 4:
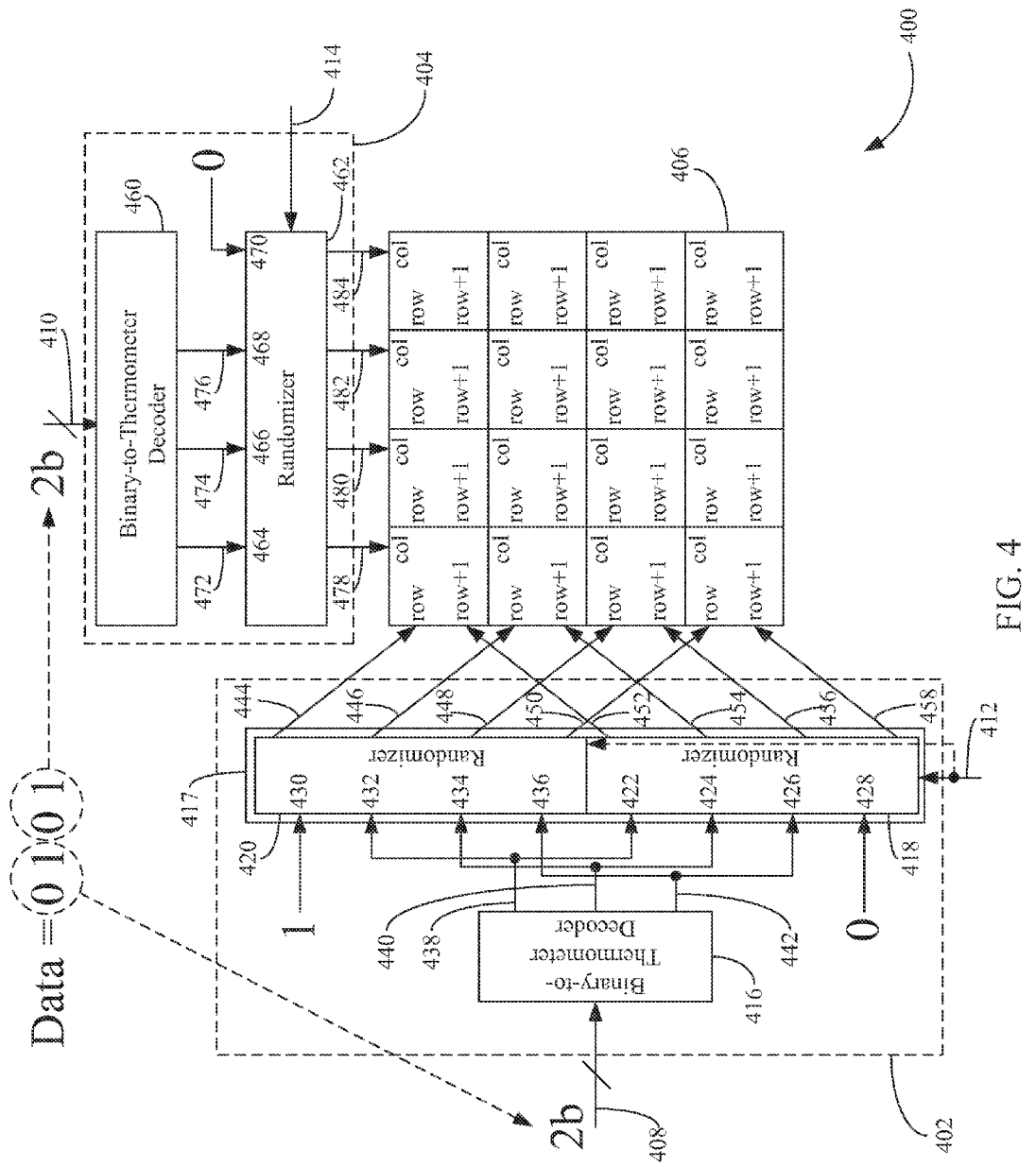
FIG. 4 depicts a block diagram of an example implementation of a row decoder and a column decoder of a dynamic element matching row/column decoder, according to an example embodiment.

FIG. 4 depicts a block diagram of an example implementation of a row decoder 402 and a column decoder 404 of a DEM row/column decoder 400. As shown in FIG. 4, row decoder 402 and column decoder 404 are coupled to a matrix of current cells 406. DEM row/column decoder 400 is an example of DEM row/column decoder 200, as shown in FIG. 2. Thus, row decoder 402, column decoder 404, and matrix of current cells 406 are an example of first decoder 202, second decoder 204, and matrix of current cells 206, as respectively shown in FIG. 2.

As shown in FIG. 4, row decoder 402 may include a binary-to-thermometer decoder 416, and a randomizer 417. Binary-to-thermometer 416 is configured to receive and decode a first plurality of input data bits in accordance to a binary-to-thermometer decoding scheme, which converts an M-bit data input into its equivalent $2^M-1$ bit thermometer-decoded value, where M is any positive integer. For example, in an embodiment where the input data bits comprise two bits (as shown in FIG. 4), binary-to-thermometer decoder 416 performs the following decoding scheme: if the 2-bit data input is '00', then the 3-bit thermometer-decoded value is '000'; if the 2-bit data input is '01', then the 3-bit thermometer-decoded value is '001'; if the 2-bit data input is '10', then the 3-bit thermometer-decoded value is '011'; if the 2-bit data input is '11', then the 3-bit thermometer-decoded value is '111'. The thermometer-decoded value is used to provide some of the 'row' and 'row+1' control signals to the rows of current cells in matrix of current cells 206 (other 'row' and 'row+1' control signals that are provided to particular cells of matrix of current cells 206 may be set (e.g., hardcoded) to a predetermined value, as described below).

Randomizer 417 is configured to randomize the thermometer-decoded value received thereby. In accordance with an embodiment, randomizer 417 comprises a first randomizer 418 and a second randomizer 420. As shown in FIG. 4, each bit of the thermometer-decoded value is provided to a respective input of first randomizer 418 and second randomizer 420, where the respective inputs of first randomizer 418 and second randomizer 420 are subsequent inputs with respect to each other. For example, as shown in FIG. 4, first randomizer 418 includes a first input 422, a second input 424, a third input 426, and a fourth input 428, and second randomizer 420 includes a first input 430, a second input 432, a third input 434, and a fourth input 436. The least significant bit (LSB) of the thermometer-decoded value is provided to first input 422 of first randomizer 418 and second input 432 of second randomizer 420 via a signal line 438, the next significant bit of the thermometer-decoded value is provided to second input 424 of first randomizer 418 and third input 434 of second randomizer 420 via a signal line 440, and the most significant bit (MSB) of the thermometer-decoded value is provided to third input 426 of first randomizer 418 and fourth input 436 of second randomizer 420 via a signal line 442. Fourth input 428 of first randomizer 418 is configured to receive a predetermined value of '0' (logical low signal value), and first input 430 of second randomizer 420 is configured to receive a predetermined value of '1'.

Second randomizer 420 may be configured to generate the 'row' control signals for each row of current sources of matrix of current cells 406 based on the input data bits received thereby via first input 430, second input 432, third input 434, and fourth input 436, and first randomizer 418 may be configured to generate the 'row+1' control signals for each row of current sources of matrix of current cells 406 based on the input data bits received thereby via first input 422, second input 424, third input 426, and fourth input 428. The data bit value received at first input 430 of second randomizer 420, and the data bit value received at first input 422 of first randomizer 418 correspond to a first 'row' and 'row+1' control signal pair. The data bit value received at second input 432 of second randomizer 420, and the data bit value received at second input 424 of first randomizer 418 correspond to a second 'row' and 'row+1' control signal pair. The data bit value received at third input 434 of second randomizer 420, and the data bit value received at third input 426 of first randomizer 418 correspond to a third 'row' and 'row+1' control signal pair. The data bit value received at fourth input 436 of second randomizer 420, and the data bit value received at fourth input 428 of first randomizer 418 correspond to a fourth 'row' and 'row+1' control signal pair.

First randomizer 418 and second randomizer 420 are configured to perform DEM by randomizing the respective 'row' control signals and 'row+1' control signals received thereby. The first randomizer 418 may randomize the 'row' control signals and the second randomizer 420 may randomize the 'row+1 control signals in accordance to the same randomization scheme. For example, each of first randomizer 418 and second randomizer 420 may receive the same control signal 412, which provides a pseudorandom bit sequence that cause first randomizer 418 and second randomizer 420 to randomize their respective input data bits (i.e., the 'row' and 'row+1' control signals). In accordance with an embodiment, the pseudorandom bit sequence causes each of first randomizer 418 and second randomizer 420 to shift their respective input data bits by a value corresponding to the pseudorandom bit sequence. It will be recognized that other randomization schemes may be used to randomize the input data bits of first randomizer 418 and second randomizer 420.

The coupling between binary-to-thermometer decoder 416 and the two randomizers (i.e., first randomizer 418 and second randomizer 420) as described above, and the usage of the same randomization scheme enable the randomization of the 'row' and 'row+1' control signals to be performed pairs-wise (i.e., each of the 'row' and 'row+1' control signal pairs are randomized as a pair, rather than on an individual basis).

The randomized 'row' control signals are provided to the rows of current cells of matrix of current cells 406 via signal lines coupling second randomizer 420 and matrix of current cells 406. For example, a first randomized 'row' control signal is provided to the first row of current cells of matrix of current cells 406 via a signal line 444, a second randomized 'row' control signal is provided to the second row of current cells of matrix of current cells 406 via a signal line 446, a third randomized 'row' control signal is provided to the third row of current cells of matrix of current cells 406 via a signal line 448, and a fourth randomized 'row' control signal is provided to the fourth row of current cells of matrix of current cells 406 via a signal line 450.

The randomized 'row+1' control signals are provided to the rows of current cells of matrix of current cells 406 via signal lines coupling first randomizer 418 and matrix of current cells 406. For example, a first randomized 'row+1' control signal is provided to the first row of current cells of matrix of current cells 406 via a signal line 452, a second randomized 'row+1' control signal is provided to the second row of current cells of matrix of current cells 406 via a signal line 454, a third randomized 'row+1' control signal is provided to the third row of current cells of matrix of current cells 406 via a signal line 456, and a fourth randomized 'row+1' control signal is provided to the fourth row of current cells of matrix of current cells 406 via a signal line 458.

Column decoder 404 may include a binary-to-thermometer decoder 460 and a randomizer 462. Binary-to-thermometer decoder 460 is configured to receive and decode a second plurality of input data bits in accordance to a binary-to-thermometer decoding scheme as described above with reference to binary-to-thermometer decoder 416. The thermometer-decoded value is used to provide some of the 'column' control signals to the columns of matrix of current cells 206 (one or more other 'column' control signals that are provided to particular cells of matrix of current cells 206 may be set (e.g., hardcoded) to a predetermined value, as described below).

Randomizer 462 is configured to randomize the input data bits (i.e., the 'column' control signals) received thereby. Each bit of the thermometer-decoded value is provided to a respective input of randomizer 462. For example, as shown in FIG. 4, randomizer 462 includes a first input 464, a second input 466, a third input 468, and a fourth input 470. The LSB of the thermometer-decoded value is provided to first input 464 via a signal line 472, the next significant bit of the thermometer-decoded value is provided to second input 466 via a signal line 474, and the MSB of the thermometer-decoded value is provided to third input 468 via a signal line 476. Fourth input 470 of randomizer 462 is configured to receive a predetermined value of '0'.

Randomizer 462 is configured to perform DEM by randomizing the 'column' control signals received thereby. Randomizer 462 may receive a control signal 414 that provides a pseudorandom bit sequence that causes randomizer 462 to randomize the 'column' control signals. In accordance with an embodiment, the pseudorandom bit sequence causes randomizer 462 to shift its input data bits by a value corresponding to the pseudorandom bit sequence. It will be recognized that other randomization schemes may be used to randomize the input data bits of randomizer 462.

The randomized 'column' control signals are provided to the columns of current cells of matrix of current cells 406 via signals lines coupling randomizer 462 and matrix of current cells 406. For example, a first randomized 'column' control signal is provided to the first column of current cells of matrix of current cells 406 via a signal line 478, a second randomized 'column' control signal is provided to the second column of current cells of matrix of current cells 406 via a signal line 480, a third randomized 'column' control signal is provided to the third column of current cells of matrix of current cells 406 via a signal line 482, and a fourth randomized 'column' control signal is provided to the fourth column of current cells of matrix of current cells 406 via a signal line 484.

Each current cell of matrix of current cells 406 may include decoding logic that is configured to enable a respective current source based on the received 'row', 'row+1', and 'column' control signals. In accordance with an embodiment, if the 'row' control signal of a particular row is enabled (e.g., the 'row' control signal is a logical high signal value), the current sources in that row are enabled or disabled based on 'column' control signals. If the 'row+1' control signal of a particular row is enabled (e.g., the 'row+1' control signal is a logical high signal value), all the current sources in that row are enabled, irrespective of the 'column' control signals. An example of the decoding logic used for each current cell is described above with reference to FIGS. 3A and 3B.

Figure 5:
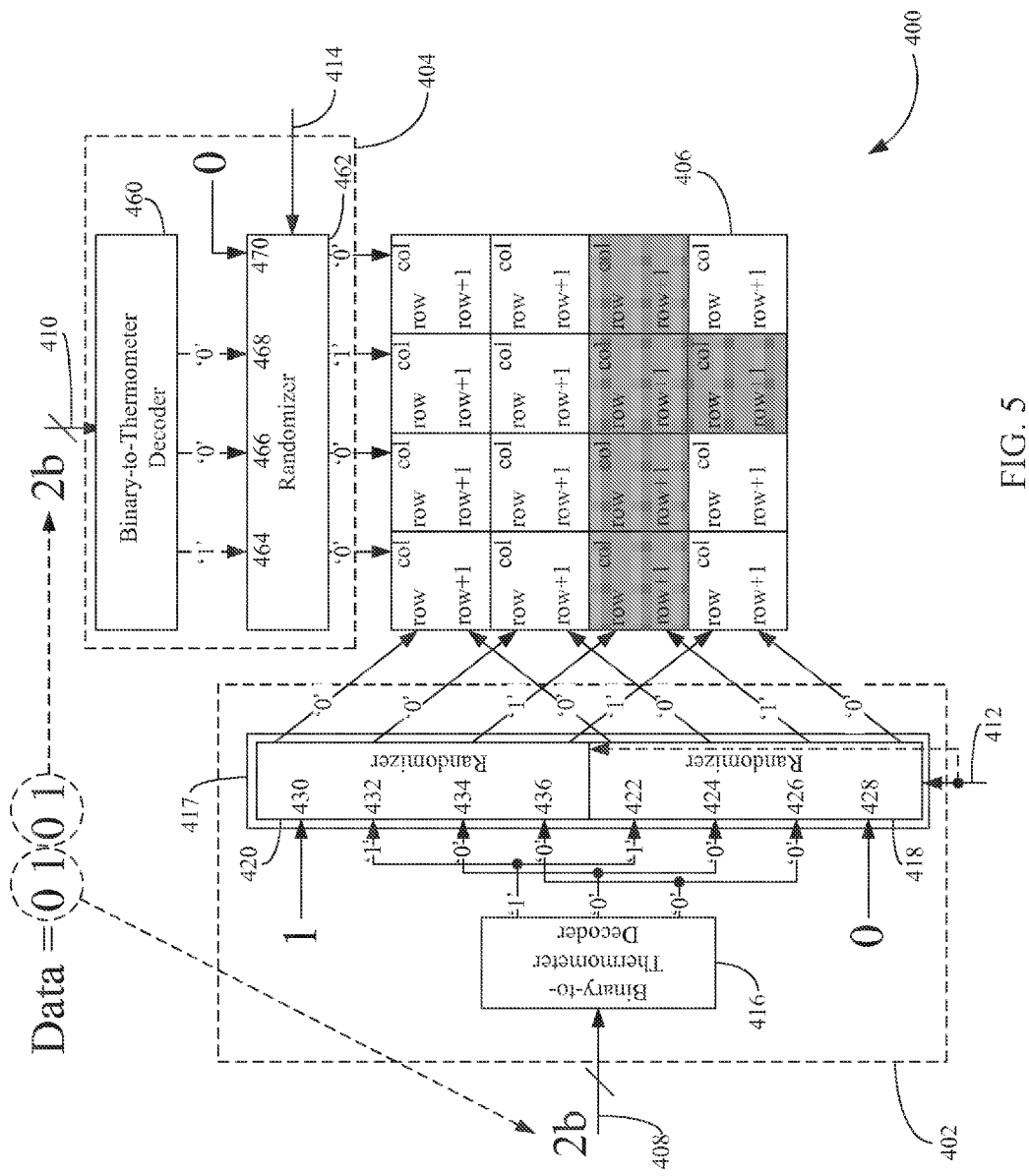
FIG. 5 illustrates a plurality of current sources in a plurality of current cells in a matrix of current cells, according to an example embodiment.

FIG. 5 illustrates a plurality of current sources in a plurality of current cells in matrix of current sources 406, according to an illustrative example. As shown in FIG. 5, DEM row/column decoder 400 receives a 4-bit digital data input equal to '0101'. The 4-bit digital data input is segmented into two groups, where row decoder 402 receives a first plurality of bits of the 4-bit data input (i.e., a 2-bit input equal to '01'), and column decoder 404 receives a second plurality of bits of the 4-bit data input (i.e., a 2-bit input equal to '01'). Binary-to-thermometer decoder 416 decodes the 2-bit data input to generate a thermometer-decoded value of '001'. First randomizer 418, thus receives '0001' at its inputs (i.e., an input data bit value of '1' is received at first input 422, an input data bit value of '0' is received at second input 424, an input data bit value of '0' is received at third input 426, and an input data value of '0' is received at fourth input 428), and second randomizer 420 receives '0011' at its inputs (i.e., an input data bit value of '1' is received at first input 430, an input data bit value of '1' is received at second input 432, an input data bit value of '0' is received at third input 434, and an input data value of '0' is received at fourth input 436).

The input data bits received at first input 430 of second randomizer 420 (i.e., '1') and first input 422 of first randomizer 418 (i.e., '1') correspond to a first 'row' and 'row+1' control signal pair (having the value '11'), the input data bits received at second input 432 of second randomizer 420 (i.e., '1') and second input 424 of first randomizer 418 (i.e., '0') correspond to a second 'row' and 'row+1' control signal pair (having the value '01'), the input data bits received at third input 434 of second randomizer 420 (i.e., '0') and third input 426 of first randomizer 418 (i.e., '0') correspond to a third 'row' and 'row+1' control signal pair (having the value '00'), and the input data bits received at fourth input 436 of second randomizer 420 (i.e., '0') and fourth input 428 of first randomizer 418 (i.e., '0') correspond to a fourth 'row' and 'row+1' control signal pair (having the value '00').

In the example shown in FIG. 5, control signal 412 provides a pseudorandom bit sequence that causes each of first randomizer 418 and second randomizer 420 to shift the input data bits received thereby by two. As shown in FIG. 5, the randomized 'row' control signals generated by second randomizer 420 are equal to '1100', and the randomized 'row+1' control signals generated by first randomizer 418 are equal to '0100'. Accordingly, the first 'row' and 'row+1' control signal pair (having the value '11') has been randomized such that it is provided to the third row of matrix of current cells 406 (as opposed to be being provided to the first row of matrix of current cells 406), the second 'row' and 'row+1' control signal pair (having the value '01') has been randomized such that it is provided to the fourth row of matrix of current cells 406 (as opposed to be being provided to the second row of matrix of current cells 406), the third 'row' and 'row+1' control signal pair (having the value '00') has been randomized such that it is provided to the first row of matrix of current cells 406 (as opposed to be being provided to the third row of matrix of current cells 406), and the fourth 'row' and 'row+1' control signal pair (having the value '00') has been randomized such that it is provided to the second row of matrix of current cells 406 (as opposed to be being provided to the fourth row of matrix of current cells 406).

Binary-to-thermometer decoder 460 decodes its received 2-bit data input to generate a thermometer-decoded value of '001'. Randomizer 462, thus receives '0001' at its inputs (i.e., an input data bit value of '1' is received at first input 464, an input data bit value of '0' is received at second input 466, an input data bit value of '0' is received at third input 468, and an input data value of '0' is received at fourth input 470).

The input data bit received at first input 464 (i.e., '1') corresponds to a first 'column' control signal, the input data bit received at second input 466 (i.e., '0') corresponds to a second 'column' control signal, the input data bit received at third input 468 (i.e., '0') corresponds to a third 'column' control signal, and the input data bit received at fourth input 470 (i.e., '0') corresponds to a fourth 'column' control signal.

In the example shown in FIG. 5, control signal 414 provides a pseudorandom bit sequence that causes randomizer 462 to shift the input data bits received thereby by two. Accordingly, the randomized 'column' control signals generated by second randomizer 420 are equal to '0010'. In this manner, the first 'column' control signal (having the value '1') has been randomized such that it is provided to the third column of matrix of current cells 406 (as opposed to be being provided to the first column of matrix of current cells 406), the second 'column' control signal (having the value '0') has been randomized such that it is provided to the fourth column of matrix of current cells 406 (as opposed to be being provided to the second column of matrix of current cells 406), the third 'column' control signal (having the value '0') has been randomized such that it is provided to the first column of matrix of current cells 406 (as opposed to be being provided to the third column of matrix of current cells 406), and the fourth 'column' control signal (having the value '0') has been randomized such that it is provided to the second column of matrix of current cells 406 (as opposed to be being provided to the fourth column of matrix of current cells 406).

In accordance to decoding logic 300A or 300B as respectively shown in FIGS. 3A and 3B, based on the values of 'row', 'row+1' and 'column' control signals provided to each current cell of matrix of current cells 406, all of the current sources in the third row of matrix of current cells 406 and the current source in the third column of the fourth row of matrix of current cells 406 are enabled. As shown in FIG. 5, the shaded current cells represent the cells in which current sources are enabled.

Figure 6:
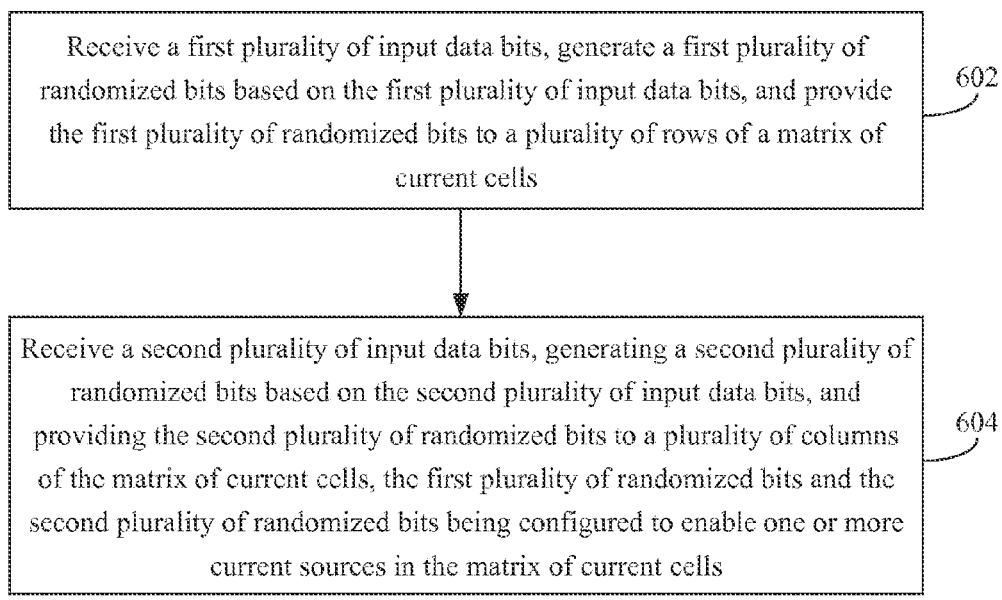
FIG. 6 shows a flowchart of an example method for randomizing input data bits that are provided to one or more current cells in a matrix of current cells, according to an example embodiment.

Accordingly, in embodiments, DEM row/column decoder 400 may operate in various ways to randomize input data bits that are provided to current cell(s) in a matrix of current cells. For example, FIG. 6 depicts a flowchart 600 of a method for randomizing input data bits that are provided to current cell(s) in a matrix of current cells in accordance with an embodiment. The method of flowchart 600 is described as follows with continued reference to DEM row/column decoder 400 of FIG. 4, although the method is not limited to that implementation. Other structural and operational embodiments will be apparent to persons skilled in the relevant art(s) based on the discussion regarding flowchart 600 and DEM row/column decoder 400.

As shown in FIG. 6, a first plurality of input data bits is received, a first plurality of randomized bits based on the first plurality of input data bit is generated, and the first plurality of randomized is provided to a plurality of rows of a matrix of current cells (602).

For example, with reference to FIG. 4, first decoder 402 receives a first plurality of input data bits via signal line(s) 408. The first plurality of input data bits are randomized by first randomizer 417 to generate the first plurality of randomized bits. The first plurality of randomized bits are provided to a plurality of rows of matrix of current cells 406.

Continuing with flowchart 600, a second plurality of input data bits is received, a second plurality of randomized bits is generated based on the second plurality of input data bits, and the second plurality of randomized bits are provided to a plurality of columns of the matrix of current cells (604). The first plurality of randomized bits and the second plurality of randomized bits are configured to enable one or more current sources in the matrix of current cells.

For example, with reference to FIG. 4, second decoder 404 receives a second plurality of input data bits via signal line(s) 410. The second plurality of input data bits are randomized by second randomizer 462 to generate the second plurality of randomized bits. The first plurality of randomized bits and the second plurality of randomized bits are provided to the current cells of matrix of current cells 406 for enabling current source(s) included therein.

In accordance with one or more embodiments, a first plurality of decoded bits are generated based on the received first plurality of input data bits, and the first plurality of decoded bits are randomized to generate the first plurality of randomized bits. For example, with reference to FIG. 4, binary-to-thermometer decoder 416 receives and decodes the first plurality of input data bits to generate the first plurality of decoded bits, and randomizer 417 randomizes the first plurality of decoded bits to generate the first plurality of randomized bits.

In accordance with one or more embodiments, the plurality of decoded bits are received and randomized to generate a first subset of the first plurality of randomized bits and the first plurality of decoded bits are received and randomized to generate a second subset of the first plurality of randomized bits. For example, with reference to FIG. 4, first randomizer 418 receives and randomizes the first plurality of decoded bits to generate the first subset of the first plurality of randomized bits, and second randomizer 420 receives and randomizes the first plurality of decoded bits to generate the second subset of the first plurality of randomized bits.

In accordance with one or more embodiments, first randomizer 418 randomizes the first plurality of decoded bits based on a first pseudorandom bit sequence, and second randomizer 420 randomizes the second plurality of decoded bits based on a second pseudorandom bit sequence.

In accordance with one or more embodiments, the first pseudorandom bit sequence and the second pseudorandom bit sequence are the same.

In accordance with one or more embodiments, the first subset of randomized bits correspond to a first subset of row control signals and the second subset of randomized bits correspond to a second subset of row control signals. Each row of current cells of the matrix of current cells is coupled to a respective row control signal of the first subset of row control signals and a respective row control signal of the second subset of row control signals. The second plurality of randomized bits correspond to column control signals. Each column of current cells in the matrix of current cells is coupled to a respective column control signal of the column control signals.

For example, with reference to FIG. 4, the first subset of randomized bits generated by first randomizer 418 correspond to 'row+1' control signals that are coupled to each row of current cells of matrix of current cells 406, and the second subset of randomized bits generated by second randomizer 420 correspond to 'row' control signals that are coupled to each row of current cells of matrix of current cells 406. With further reference to FIG. 4, the second plurality of randomized bits generated by randomizer 462 correspond to 'column' control signals that are coupled to column(s) of matrix of current cells 406.

In accordance with one or more embodiments, a determination is made that a row control signal of the first subset of row control signals coupled to a particular row of current cells in the matrix of current cells is enabled. In response to determining that the row control signal is enabled, a plurality of current sources in the particular row is enabled. For example, with reference to FIG. 4, a determination is made that a 'row+1' control signal of the 'row+1' control signals generated by first randomizer 418 is enabled. The plurality of current sources in the particular row of current cells to which the enabled 'row+1' control signal is coupled is enabled in response to determining that the 'row+1' control signal is enabled.

In accordance with one or more embodiments, a determination is made that a row control signal of the second subset of row control signals coupled to a particular current cell in the matrix of current cells and a column control signal coupled to the particular current cell are enabled. In response to determining that the row control signal of the second subset of row control signals and the column control signal coupled to the particular current cell are enabled, a particular current source of the particular current cell is enabled. For example, with reference to FIG. 4, a determination is made that a 'row' control signal of the 'row' control signals generated by second randomizer 420 and a 'column' control signal of the 'column' control signals generated by randomizer 462 are enabled. The current source of the current cell coupled to the enabled 'row' control signal and enabled 'column' control signal is enabled.

B. N-Dimensional Decoder in a Current-Steering DAC

Figure 7:
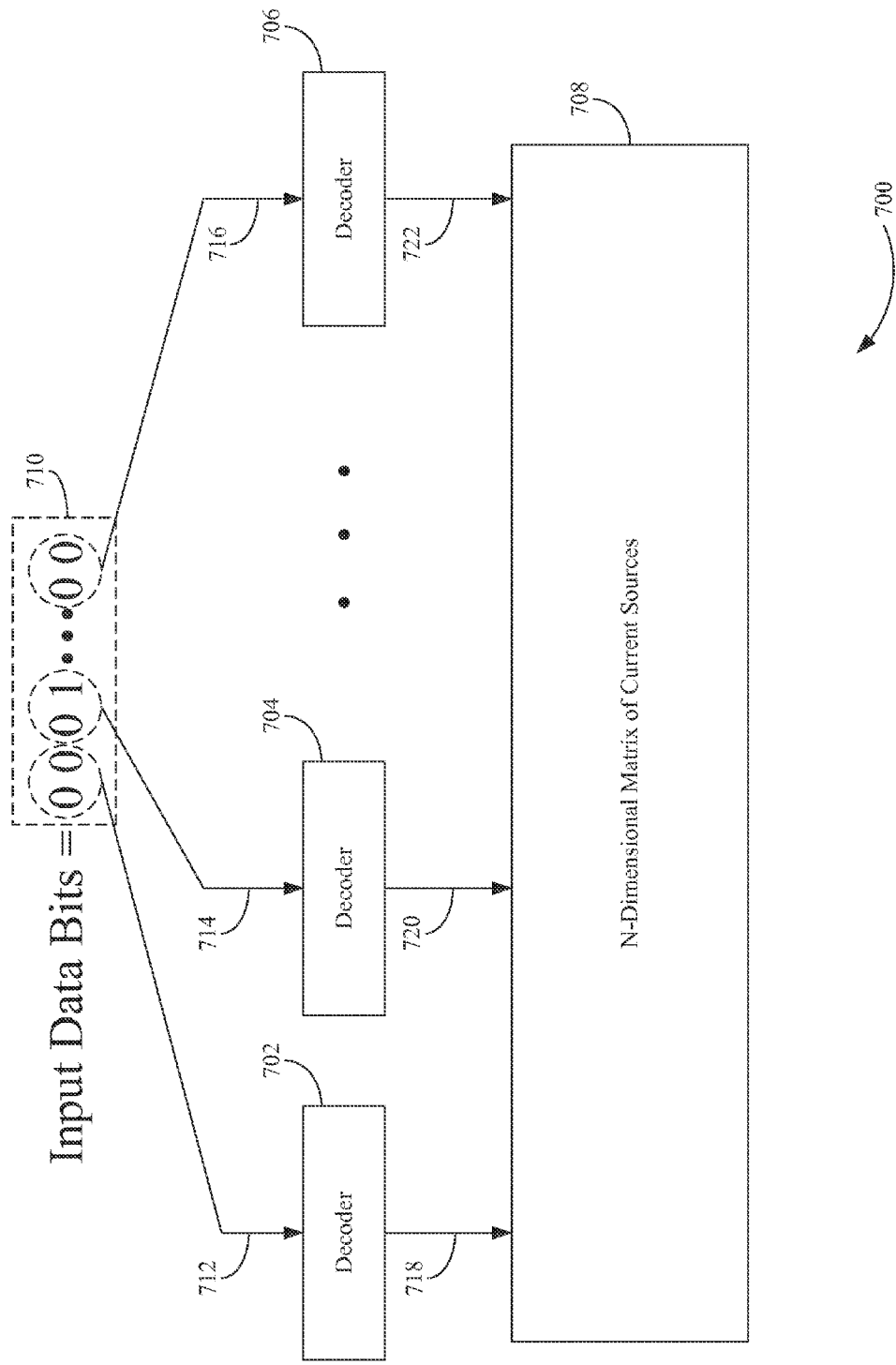
FIG. 7 depicts a block diagram of an N-dimensional decoder for a current-steering DAC, where N is any integer greater than two, according to an example embodiment.

As described above, a current-steering DAC may include more than two decoders, in embodiments. For instance, FIG. 7 depicts a block diagram of an N-dimensional decoder 700 for a current-steering DAC, where N is any integer greater than two, in accordance with an embodiment. N-dimensional decoder 700 may be included in current-steering DAC 104, as shown in FIG. 1.

As shown in FIG. 7, N-dimensional decoder 700 includes a first decoder 702, a second decoder 704, an Nth decoder 706, and an N-dimensional matrix of current cells 708. Each current cell in N-dimensional matrix of current cells 708 may include a current source and/or decoding logic used to enable the current source. As shown in FIG. 7, digital input data bits 710 are segmented into a first plurality of input data bits, a second plurality of input data bits, and an Nth plurality of input data bits. First decoder 702 is configured to receive the first plurality of input data bits via signal line(s) 712 and decode the first plurality of input data bits in accordance to a particular decoding scheme to generate a first plurality of decoded bits. The first plurality of decoded bits may be provided to a first dimension of N-dimensional matrix of current cells 708. The first plurality of decoded bits may be provided as control signals used in combination with other pluralities of decoded bits (e.g., a second plurality of decoded bits and an Nth plurality of decoded bits, as described below) to enable one or more current sources in the first dimension of N-dimensional matrix of current cells 708. In accordance with an embodiment, first decoder 702 is configured to randomize the first plurality of decoded bits to generate a first plurality of randomized bits, which are provided to the first dimension of N-dimensional matrix of current cells 708 (instead of the first plurality of decoded bits) in accordance to the randomization scheme described above in subsection A.

Second decoder 704 is configured to receive the second plurality of input data bits via signal line(s) 714 and decode the second plurality of input data bits in accordance to a particular decoding scheme to generate a second plurality of decoded bits. The second plurality of decoded bits may be provided to a second dimension of N-dimensional matrix of current cells 708. The second plurality of decoded bits may be provided as control signals used in combination with the first plurality of decoded bits and the Nth plurality of decoded bits (as described below) to enable one or more current sources in the second dimension of N-dimensional matrix of current cells 708. In accordance with an embodiment, second decoder 704 is configured to randomize the second plurality of decoded bits to generate a second plurality of randomized bits, which are provided to the second dimension of N-dimensional matrix of current cells 708 (instead of the second plurality of decoded bits) in accordance to the randomization scheme described above in subsection A.

Nth decoder 706 is configured to receive the Nth plurality of input data bits via signal line(s) 716 and decode the Nth plurality of input data bits in accordance to a particular decoding scheme to generate an Nth plurality of decoded bits. The Nth plurality of decoded bits may be provided to an Nth dimension of N-dimensional matrix of current cells 708. The Nth plurality of decoded bits may be provided as control signals used in combination with the first plurality of decoded bits and second plurality of decoded bits to enable one or more current sources in the Nth dimension of N-dimensional matrix of current cells 708. In accordance with an embodiment, Nth decoder 706 is configured to randomize the Nth plurality of decoded bits to generate an Nth plurality of randomized bits, which are provided to the Nth dimension of N-dimensional matrix of current cells 708 (instead of the Nth plurality of decoded bits) in accordance to the randomization scheme described above in subsection A.

Figure 8:
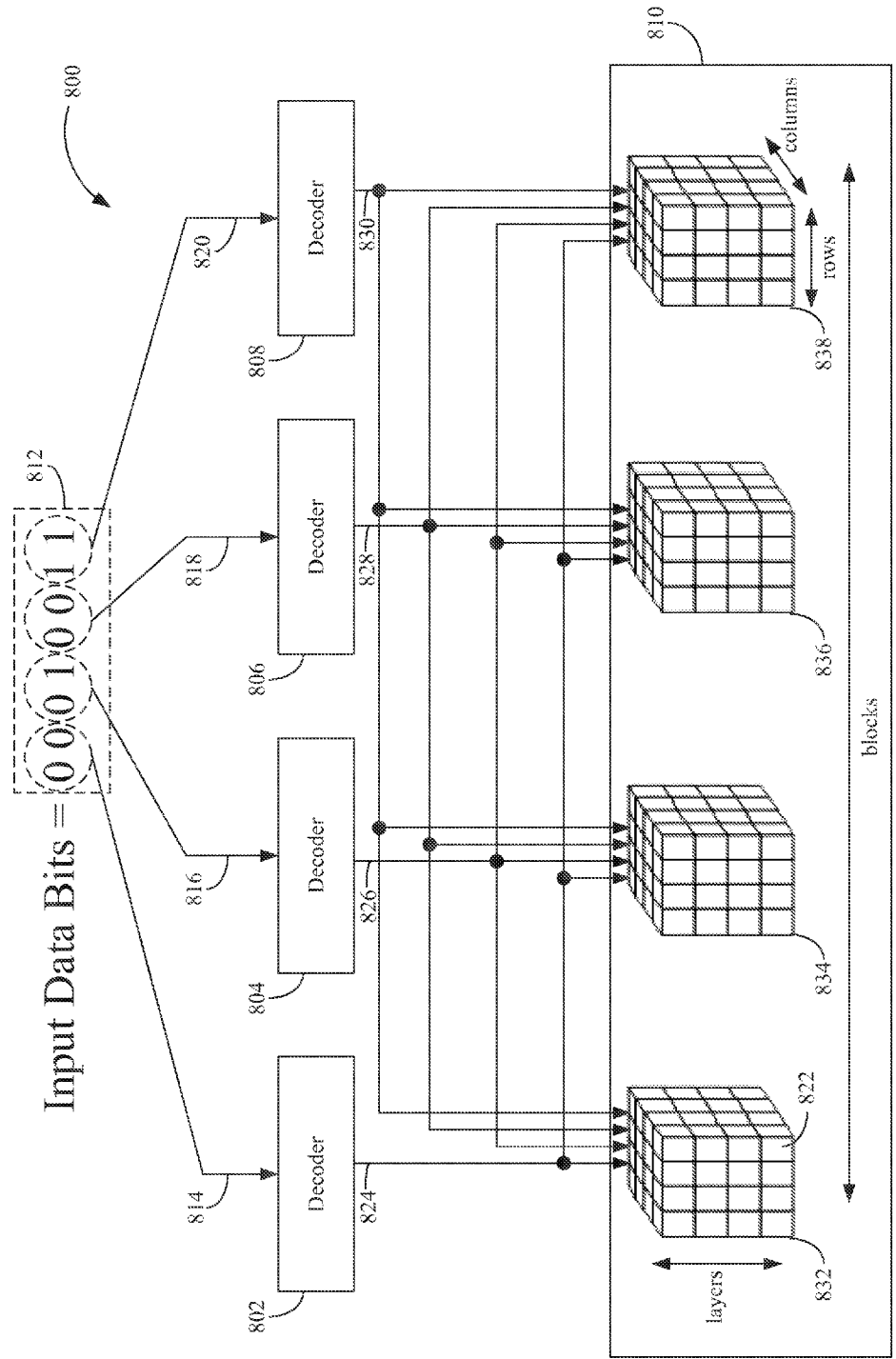
FIG. 8 depicts a block diagram of a four-dimensional decoder for a current-steering DAC, according to an example embodiment.

FIG. 8 depicts a block diagram of a four-dimensional decoder 800 for a current-steering DAC, in accordance with an embodiment. Four-dimensional decoder 800 may be included in current-steering DAC 104, as shown in FIG. 1. Four-dimensional decoder 800 may be an example of N-dimensional decoder 700, as shown in FIG. 7. As shown, in FIG. 8, four-dimensional decoder 800, includes a first decoder 802, a second decoder 804, a third decoder 806, a fourth decoder 808, and a four-dimensional matrix of current cells 810.

As shown in FIG. 8, digital input data bits 812 are segmented into a first plurality of input data bits, a second plurality of input data bits, a third plurality of input data bits, and a fourth plurality of input data bits. First decoder 802 is configured to receive the first plurality of input data bits via signal line(s) 814 and decode the first plurality of input data bits in accordance to a particular decoding scheme to generate a first plurality of decoded bits. Second decoder 804 is configured to receive the second plurality of input data bits via signal line(s) 816 and decode the second plurality of input data bits in accordance to a particular decoding scheme to generate a second plurality of decoded bits. Third decoder 806 is configured to receive the third plurality of input data bits via signal line(s) 818 and decode the third plurality of input data bits in accordance to a particular decoding scheme to generate a third plurality of decoded bits. Fourth decoder 808 is configured to receive the fourth plurality of input data bits via signal line(s) 820 and decode the fourth plurality of input data bits in accordance to a particular decoding scheme to generate a fourth plurality of decoded bits.

As shown in FIG. 8, four-dimensional matrix of current cells 810 includes 256 current cells 822 arranged in four dimensions (i.e., blocks, layers, rows, and columns). For instance, current cells 822 are arranged in four blocks 832, 834, 836, and 838, each block comprising four layers, each layer comprising four rows, and each row comprising four columns. Each of current cells 822 are configured to receive a plurality of controls signals that are used to enable a current source included therein.

Figure 9:
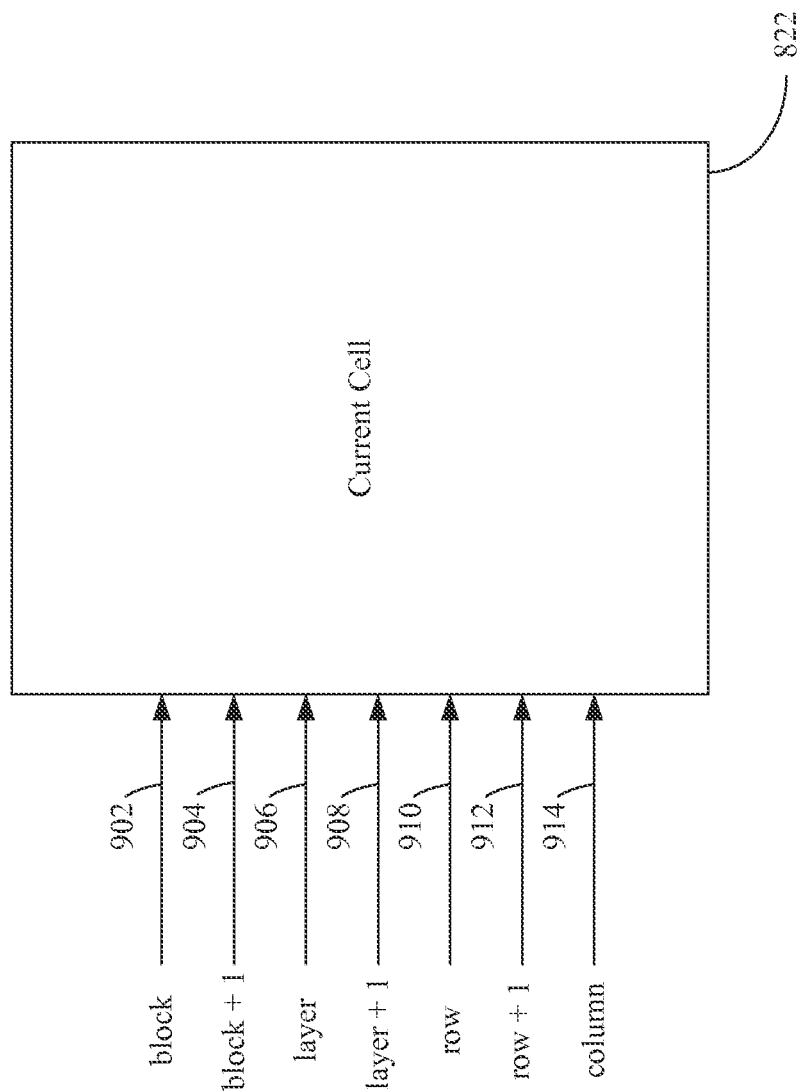
FIG. 9 shows an example of a current cell included in a four-dimensional matrix of current cells, according to an example embodiment.

FIG. 9 shows an example of current cell 822 included in four-dimensional matrix of current cells 810, in accordance with an embodiment. As shown in FIG. 9, current cell 822 is configured to receive a 'block' control signal 902, a 'block+1' control signal 904, a 'layer' control signal 906, a 'layer+1' control signal 908, a 'row' control signal 910, a 'row+1' control signal 912, and a 'column' control signal 914. 'Block' control signal 902 and 'block+1' control signal 904 are used to determine whether a particular current source in one or more blocks in four-dimensional matrix of current cells 810 are to be enabled. 'Layer' control signal 906 and 'layer+1' control signal 908 are used to determine whether a particular current source in one or more layers in one or more blocks in four-dimensional matrix of current cells 810 are to be enabled. 'Row' control signal 910 and 'row+1' control signal 912 are used to determine whether a particular current source in one or more rows in one or more layers in one or more blocks in four-dimensional matrix of current cells 810 are to be enabled. 'Column' control signal 914 is used to determine whether a current source in a particular column in one or more rows in one or more layers in one or more blocks in four-dimensional matrix of current cells 810 are to be enabled.

Referring again to FIG. 8, the first plurality of decoded bits generated by first decoder 802 may be used as one or more 'block' and/or 'block+1' control signals and may be provided to current cell(s) 822 via signal lines 824, the second plurality of decoded bits generated by second decoder 804 may be used as one or more 'layer' and/or 'layer+1' control signals and may be provided to current cell(s) 822 via signal lines 826, the third plurality of decoded bits generated by third decoder 806 may be used as one or more 'row' and/or 'row+1' control signals and may be provided to current cell(s) 822 via signal lines 828, and the fourth plurality of decoded bits generated by fourth decoder 808 may be used as 'column' control signals and may be provided to current cell(s) 822 via signal lines 830. As will be described below, some of the 'block', 'layer', 'row', and 'column' control signals provided to particular current cells may be set (e.g., hardcoded) to a predetermined value.

In accordance with an embodiment, first decoder 802, second decoder 804, third decoder 806, and/or fourth decoder 808 are configured to respectively randomize the first plurality of decoded bits, the second plurality of decoded bits, the third plurality of decoded bits, and/or the fourth plurality of decoded bits to respectively generate a first plurality of randomized bits, a second plurality of randomized bits, a third plurality of randomized bits, and/or a fourth plurality of randomized bits, which are used to enable the current source(s) in current cell(s) in four-dimensional matrix of current cells 810 (instead of using the first plurality of decoded bits, the second plurality of decoded bits, the third plurality of decoded bits, and/or the fourth plurality of decoded bits) in accordance to the randomization scheme described above in subsection A.

Figure 10A:
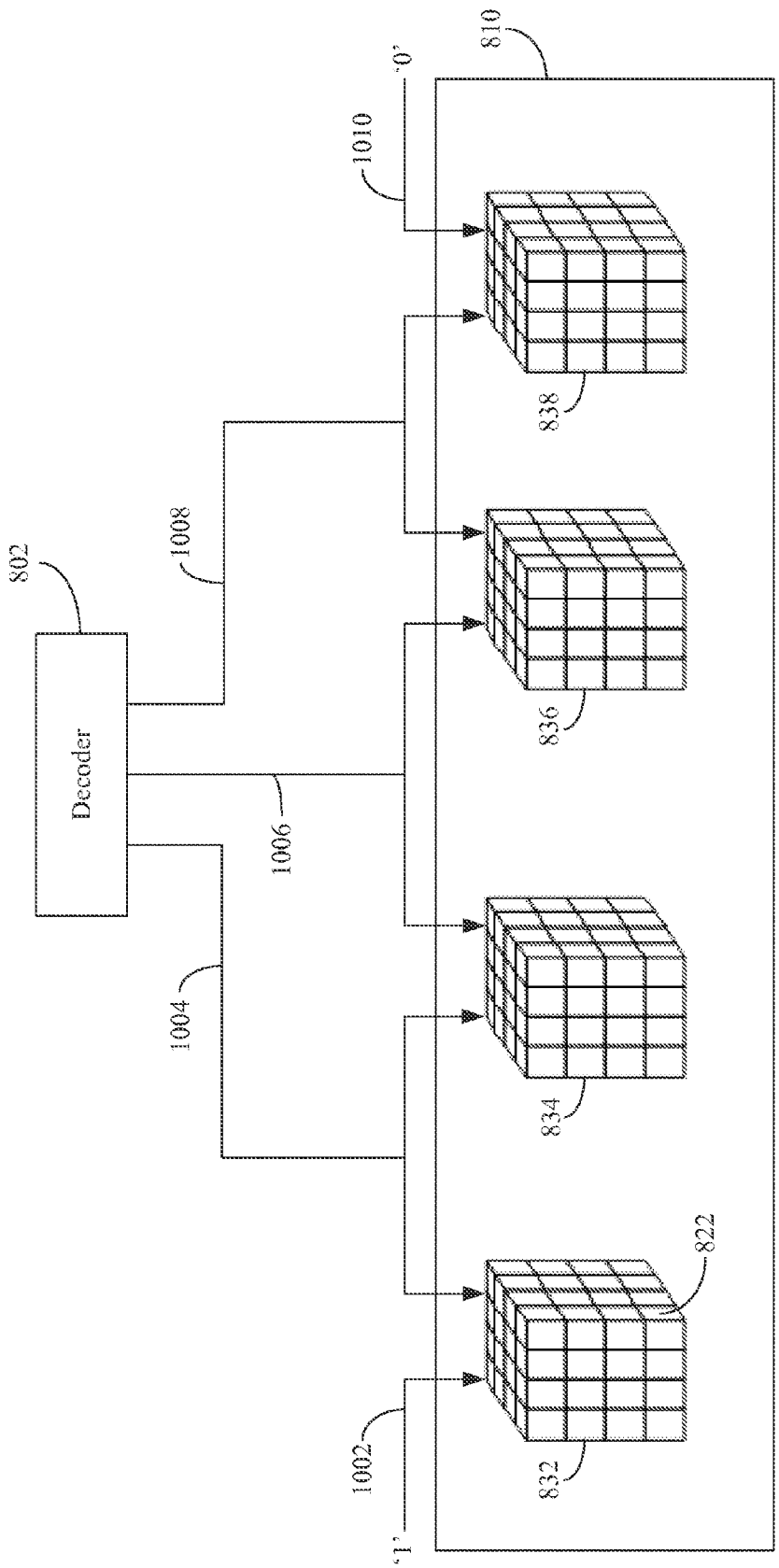
FIG. 10A depicts a block diagram showing how 'block' and 'block+1' control signals are provided to each current cell in a plurality of blocks of a four-dimensional matrix of current cells, according to an example embodiment.
Figure 10B:
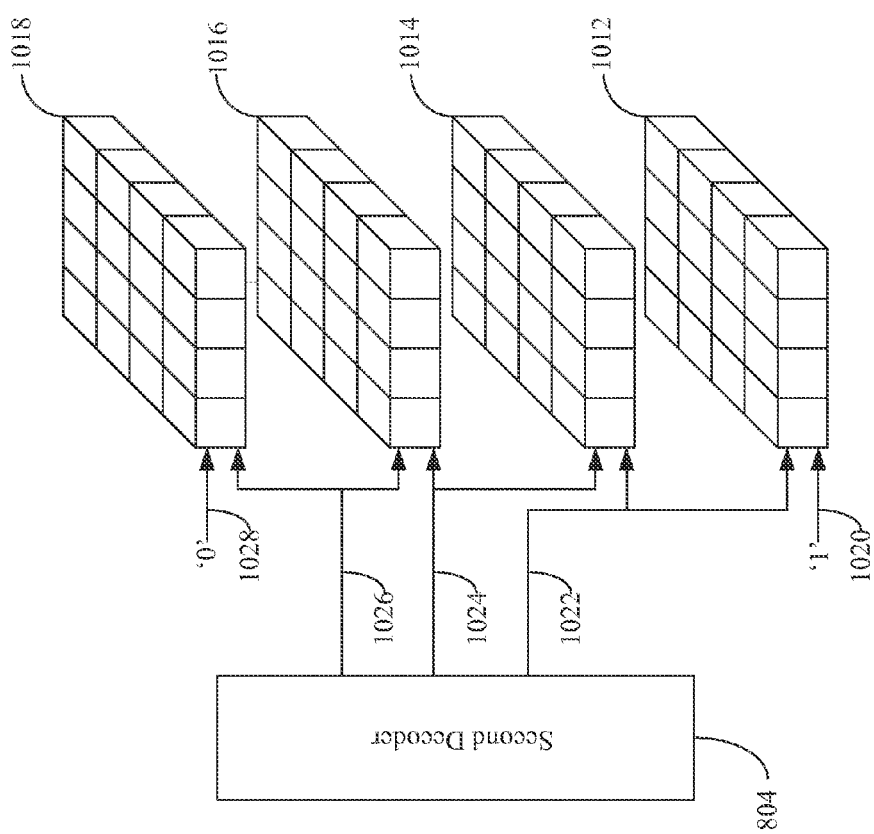
FIG. 10B depicts a block diagram showing how 'layer' and 'layer+1' control signals are provided to each current cell in a plurality of layers of a particular block of a four-dimensional matrix of current cells, according to an example embodiment.
Figure 10C:
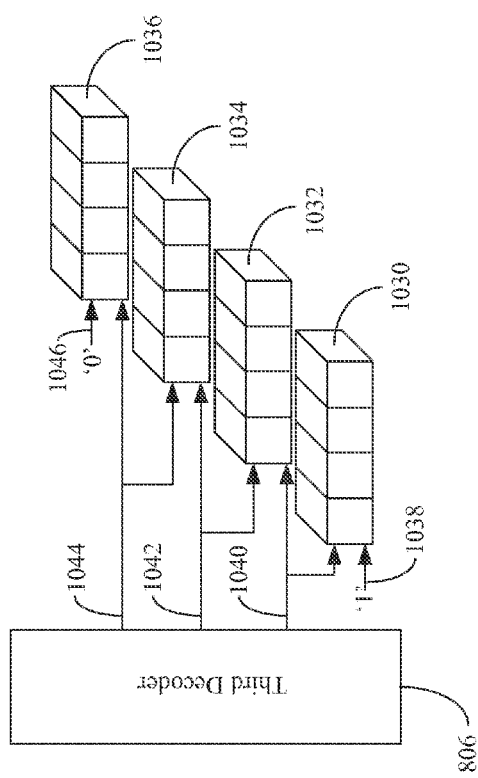
FIG. 10C depicts a block diagram showing how 'row' and 'row+1' control signals are provided to each current cell in a plurality of rows of a particular layer of a particular block of a four-dimensional matrix of current cells, according to an example embodiment.
Figure 10D:
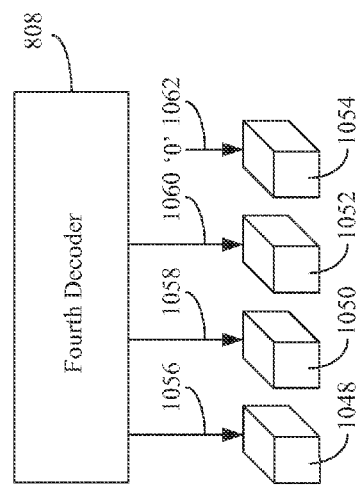
FIG. 10D depicts a block diagram showing how a 'column' control signal is provided to each current cell in a plurality of columns of a particular row of a particular layer of a particular block of a four-dimensional matrix of current cells, according to an example embodiment.

FIGS. 10A-10D depict block diagrams showing how each of the above-described control signals are coupled to current cell(s) 822 included in four-dimensional matrix 810. For example, FIG. 10A depicts a block diagram showing how 'block' and 'block+1' control signals are provided to each current cell 822 in each of first block 832, second block 834, third block 836, and fourth block 836 of four-dimensional matrix of current cells 810. FIG. 10B depicts a block diagram showing how 'layer' and 'layer+1' control signals are provided to each current cell 822 in each of a first layer 1012, a second layer 1014, a third layer 1016, and a fourth layer 1018 of a particular block of four-dimensional matrix of current cells 810. FIG. 10C depicts a block diagram showing how 'row' and 'row+1' control signals are provided to each current cell 822 in each of a first row 1030, a second row 1032, a third row 1034, and a fourth row 1036 of a particular layer of a particular block of four-dimensional matrix of current cells 810. FIG. 10D depicts a block diagram showing how a 'column' control signal is provided to each current cell 822 in each of a first column 1048, a second column 1050, a third column 1052, and a fourth column 1054 of a particular row of a particular layer of a particular block of four-dimensional matrix of current cells 810. Each of first decoder 802, second decoder 804, third decoder 806, and fourth decoder 810 respectively depicted in FIGS. 10A-10D are configured to use a binary-to-thermometer decoding scheme, which decodes a respective received 2-bit input data to its equivalent 3-bit thermometer-decoded values, as described above in subsection A. However, it is noted that embodiments described herein are not so limited and that first decoder 802, second decoder 804, third decoder 806, and/or fourth decoder 808 may use other decoding schemes.

Referring now to FIG. 10A, FIG. 10A depicts first decoder 802 (as described above in FIG. 8) coupled to first block 832, second block 834, third block 836, and fourth block 838 of four-dimensional matrix of current cells 810 via signal lines 1004, 1006, and 1008. Signal lines 1004, 1006, and 1008 collectively represent signal lines 824, as shown in FIG. 8. As shown in FIG. 10A, each current cell in first block 832 is configured to receive a 'block' control signal via signal line 1002, which is configured to receive a predetermined value of '1'. The LSB of the thermometer-decoded value (provided via signal line 1004) is provided as a 'block+1' control signal to each current cell in first block 832 and is provided as a 'block' control signal to each current cell of second block 834. The next significant bit of the thermometer-decoded value (provided via signal line 1006) is provided as a 'block+1' control signal to each current cell of second block 834 and is provided as a 'block' control signal to each current cell of third block 836. The MSB of the thermometer-decoded value (provided via signal line 1008) is provided as a 'block+1' control signal to each current cell of third block 836 and is provided as a 'block' control signal to each current cell of fourth block 838. Each current cell in fourth block 838 is configured to receive a 'block+1' control signal via signal line 1010, which is configured to receive a predetermined value of '0'.

Referring now to FIG. 10B, FIG. 10B depicts second decoder 804 (as described above in FIG. 8) coupled to first layer 1012, second layer 1014, third layer 1016, and fourth layer 1018 of a particular block of four-dimensional matrix of current cells 810 via signal lines 1022, 1024, and 1026. Signals lines 1022, 1024, and 1026 collectively represent signal lines 826, as shown in FIG. 8. Second decoder 804 is also coupled to layers of others blocks of four-dimensional matrix of current cells 810 (as shown in FIG. 8) in a similar manner as shown in FIG. 10B. However, the other blocks are not shown for the sake of brevity. As shown in FIG. 10B, each current cell in first layer 1012 (of each of first block 832, second block 834, third block 836, and fourth block 838) is configured to receive a 'layer' control signal via signal line 1020, which is configured to receive a predetermined value of '1'. The LSB of the thermometer-decoded value (provided via signal line 1022) is provided as a 'layer+1' control signal to each current cell in first layer 1012 (of each of first block 832, second block 834, third block 836, and fourth block 838) and is provided as a 'layer' control signal to each current cell in second layer 1014 (of each of first block 832, second block 834, third block 836, and fourth block 838). The next significant bit of the thermometer-decoded value (provided via signal line 1024) is provided as a 'layer+1' control signal to each current cell in second layer 1014 (of each of first block 832, second block 834, third block 836, and fourth block 838) and is provided as a 'layer' control signal to each current cell in third layer 1016 (of each of first block 832, second block 834, third block 836, and fourth block 838). The MSB of the thermometer-decoded value (provided via signal line 1026) is provided as a 'layer+1' control signal to each current cell in third layer 1016 (of each of first block 832, second block 834, third block 836, and fourth block 838) and is provided as a 'layer' control signal to each current cell in fourth layer 1028 (of each of first block 832, second block 834, third block 836, and fourth block 838). Each current cell in fourth layer 1018 (of each of first block 832, second block 834, third block 836, and fourth block 838) is configured to receive a 'layer+1' control signal via signal line 1028, which is configured to receive a predetermined value of '0'.

Referring now to FIG. 10C, FIG. 10C depicts third decoder 806 (as described above in FIG. 8) coupled to first row 1030, second row 1032, third row 1034, and fourth row 1036 of a particular layer of a particular block of four-dimensional matrix of current cells 810 via signal lines 1040, 1042, and 1044. Signal lines 1040, 1042, and 1044 collectively represent signal lines 828, as shown in FIG. 8. Third decoder 806 is also coupled to rows of other layers of the particular block and other blocks of four-dimensional matrix of current cells 810 (as shown in FIG. 8) in a similar manner as shown in FIG. 10C. However, the other layers of the particular block and the other blocks are not shown for the sake of brevity. As shown in FIG. 3C, each current cell in first row 1030 (of each of first layer 1012, second layer 1014, third layer 1016, and fourth layer 1018 of each of first block 832, second block 834, third block 836, and fourth block 838) is configured to receive a 'row' control signal via signal line 1038, which is configured to receive a predetermined value of '1'. The LSB of the thermometer-decoded value (provided via signal line 1040) is provided as a 'row+1' control signal to each current cell in first row 1030 (of each of first layer 1012, second layer 1014, third layer 1016, and fourth layer 1018 of each of first block 832, second block 834, third block 836, and fourth block 838) and is provided as a 'row' control signal to each current cell in second row 1032 (of each of first layer 1012, second layer 1014, third layer 1016, and fourth layer 1018 of each of first block 832, second block 834, third block 836, and fourth block 838). The next significant bit of the thermometer-decoded value (provided via signal line 1042) is provided as a 'row+1' control signal to each current cell in second row 1032 (of each of first layer 1012, second layer 1014, third layer 1016, and fourth layer 1018 of each of first block 832, second block 834, third block 836, and fourth block 838) and is provided as a 'row' control signal to each current cell in third row 1034 (of each of first layer 1012, second layer 1014, third layer 1016, and fourth layer 1018 of each of first block 832, second block 834, third block 836, and fourth block 838). The MSB of the thermometer-decoded value (provided via signal line 1044) is provided as a 'row+1' control signal to each current cell in third row 1034 (of each of first layer 1012, second layer 1014, third layer 1016, and fourth layer 1018 of each of first block 832, second block 834, third block 836, and fourth block 838) and is provided as a 'row' control signal to each current cell in fourth row 1036 (of each of first layer 1012, second layer 1014, third layer 1016, and fourth layer 1018 of each of first block 832, second block 834, third block 836, and fourth block 838). Each current cell in fourth row 1036 (of each of first layer 1012, second layer 1014, third layer 1016, and fourth layer 1018 of each of first block 832, second block 834, third block 836, and fourth block 838) is configured to receive a 'row+1' control signal via signal line 1046, which is configured to receive a predetermined value of '0'.

Referring now to FIG. 10D, FIG. 10D depicts fourth decoder 808 (as described above in FIG. 8) coupled to first column 1048, second column 1050, third column 1052, and fourth column 1054 of a particular row of a particular layer of a particular block of four-dimensional matrix of current cells 810 via signal lines 1056, 1068, and 1060. Signal lines 1056, 1058, and 1060 collectively represent signal lines 830, as shown in FIG. 8. Fourth decoder 808 is also coupled to columns of other rows of the particular layer and other layers of the particular block and other rows of other layers of other blocks of four-dimensional matrix of current cells 810 (as shown in FIG. 8) in a similar manner as shown in FIG. 10D. However, the other rows of the particular layer and the other layers of the particular block and the other rows of the other layers of the other blocks are not shown for the sake of brevity. As shown in FIG. 10D, the LSB of the thermometer-decoded value (provided via signal line 1056) is provided as a 'column' control signal to the current cell in first column 1048 (of each of first row 1030, second row 1032, third row 1034, and fourth row 1036 of each of first layer 1012, second layer 1014, third layer 1016, and fourth layer 1018 of each of first block 832, second block 834, third block 836, and fourth block 838). The next significant bit of the thermometer-decoded value (provided via signal line 1058) is provided as a 'column' control signal to the current cell in second column 1050 (of each of first row 1030, second row 1032, third row 1034, and fourth row 1036 of each of first layer 1012, second layer 1014, third layer 1016, and fourth layer 1018 of each of first block 832, second block 834, third block 836, and fourth block 838). The MSB of the thermometer-decoded value (provided via signal line 1060) is provided as a 'column' control signal to the current cell in third column 1052 (of each of first row 1030, second row 1032, third row 1034, and fourth row 1036 of each of first layer 1012, second layer 1014, third layer 1016, and fourth layer 1018 of each of first block 832, second block 834, third block 836, and fourth block 838). The current cell in fourth column 1054 (of each of first row 1030, second row 1032, third row 1034, and fourth row 1036 of each of first layer 1012, second layer 1014, third layer 1016, and fourth layer 1018 of each of first block 832, second block 834, third block 836, and fourth block 838) is configured to receive a 'column' control signal from signal line 1062, which is configured to receive a predetermined value of '0'.

Figure 11A:
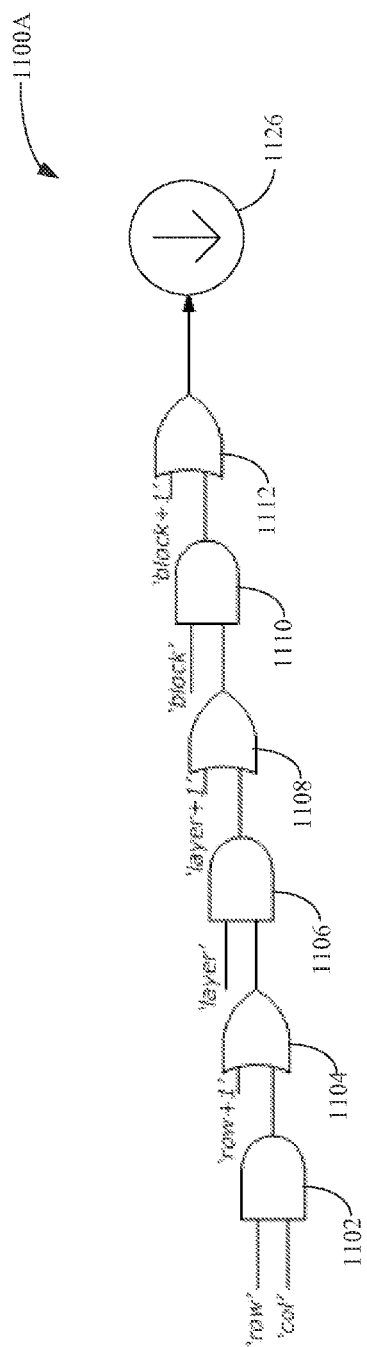
FIG. 11A shows an example implementation of decoding logic used to enable a current source in a current cell in a four-dimensional matrix of current cells, according to an example embodiment.
Figure 11B:
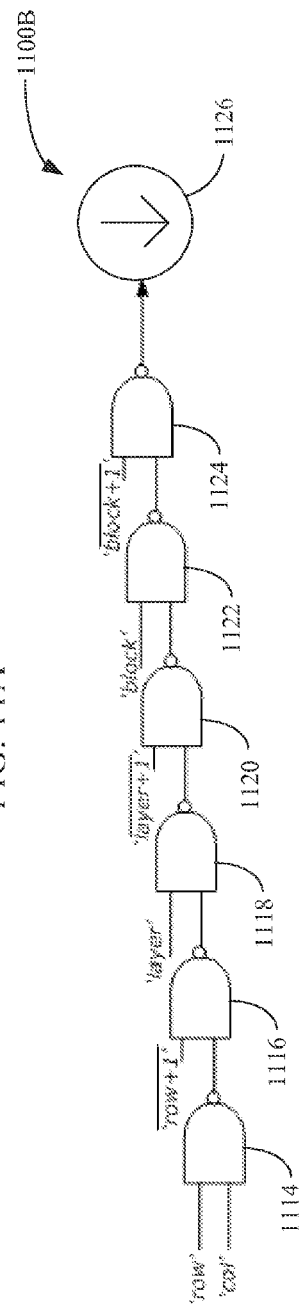
FIG. 11B shows an example implementation of decoding logic used to enable a current source in a current cell in a four-dimensional matrix of current cells, according to another example embodiment.

FIGS. 11A and 11B show example implementations of decoding logic that may be used to enable a current source in a current cell in a four-dimensional matrix of current cells in accordance with embodiments. FIG. 11A shows an implementation of decoding logic 1100A using a plurality of AND gates 1102, 1106, and 1110 and a plurality of OR gates 1104, 1108, and 1112. FIG. 11B shows an implementation of decoding logic 1100B using a plurality of NAND gates 1114, 1116, 1118, 1120, 1122, and 1124. Decoding logic 1100A or 1100B may be included in each current cell 822 of four-dimensional matrix of current cells 810 (as shown in FIG. 8). As shown in FIGS. 11A and 11B, a current source 1126 is coupled to decoding logic 1100A and 1100B. In the embodiment shown in FIG. 11A, current source 1126 is enabled when the output of OR gate 1112 is enabled (i.e., active). In the embodiment shown in FIG. 11B, current source 1126 is enabled when the output of NAND gate 1124 is enabled.

IV. Conclusion

Embodiments are not limited to the functional blocks, detailed examples, steps, order or the entirety of subject matter presented in the figures, which is why the figures are referred to as exemplary embodiments.

A device, as defined herein, is a machine or manufacture as defined by 35 U.S.C. §101. A device may comprise, for example but not limited to, an amplifier, driver, wireless device, communications device, receiver, transmitter, transceiver, etc. Devices may be digital, analog or a combination thereof. Devices (e.g., decoders, logic gates, current sources, etc.) may be implemented with any semiconductor technology, including one or more of a Bipolar Junction Transistor (BJT), a heterojunction bipolar transistor (HBT), a MOSFET device, a metal semiconductor field effect transistor (MESFET) or other transconductor or transistor technology device. Such alternative devices may require alternative configurations other than the configuration illustrated in embodiments presented herein.

Techniques, including methods, described herein may be implemented in hardware (digital and/or analog) or a combination of hardware, software and/or firmware. Techniques described herein may be implemented in one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While a limited number of embodiments have been described, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the disclosed technologies. The exemplary appended claims encompass embodiments and features described herein, modifications and variations thereto as well as additional embodiments and features that fall within the true spirit and scope of the disclosed technologies. Thus, the breadth and scope of the disclosed technologies should not be limited by any of the above-described exemplary embodiments, but should be defined only in accordance with the following claims and their equivalents.

What is claimed is:

1. An apparatus, comprising:
a first decoder configured to decode a first plurality of input data bits to generate a first plurality of decoded bits;
a first randomizer coupled to the first decoder, the first randomizer configured to randomize the first plurality of decoded bits to generate a first plurality of randomized bits, the first plurality of randomized bits being provided to one or more current cells in one or more rows of a matrix of current cells;
a second decoder configured to decode a second plurality of input data bits to generate a second plurality of decoded bits; and
a second randomizer coupled to the second decoder, the second decoder configured to randomize the second plurality of decoded bits to generate a second plurality of randomized bits, the second plurality of randomized bits being provided to one or more current cells in one or more columns of the matrix of current cells.

2. The apparatus of claim 1, wherein the first decoder comprises a first binary-to-thermometer decoder, and wherein the second decoder comprises a second binary-to-thermometer decoder.

3. The apparatus of claim 1, wherein the first randomizer comprises two randomizers, a first of the two randomizers being configured to receive and randomize the first plurality of decoded bits to generate a first subset of the first plurality of randomized bits and a second of the two randomizers being configured to receive and randomize the first plurality of decoded bits to generate a second subset of the first plurality of randomized bits.

4. The apparatus of claim 3, wherein the first of the two randomizers is configured to randomize the first plurality of the decoded bits based on a first pseudorandom bit sequence and the second of the two randomizers is configured to randomize the first plurality of the decoded bits based on a second pseudorandom bit sequence.

5. The apparatus of claim 4, wherein the first pseudorandom bit sequence and the second pseudorandom bit sequence are the same.

6. The apparatus of claim 4, wherein the first of the two randomizers is configured to randomize the first plurality of the decoded bits based on the first pseudorandom bit sequence by shifting the first plurality of the decoded bits by a number of bits specified by the first pseudorandom bit sequence, and wherein the second of the two randomizers is configured to randomize the first plurality of the decoded bits based on the second pseudorandom bit sequence by shifting the first plurality of the decoded bits by a number of bits specified by the second pseudorandom bit sequence.

7. The apparatus of claim 1, wherein the first plurality of randomized bits comprises a first subset of randomized bits and a second subset of randomized bits, wherein the first subset of randomized bits correspond to a first subset of row control signals and the second subset of randomized bits correspond to a second subset of row control signals, wherein each row of the one or more rows of current cells of the matrix of current cells is coupled to a respective row control signal of the first subset of row control signals and a respective row control signal of the second subset of row control signals; and wherein the second plurality of randomized bits correspond to column control signals, wherein each column of the one or more columns of current cells in the matrix of current cells is coupled to a respective column control signal of the column control signals.

8. The apparatus of claim 7, wherein current sources in a particular row of the one or more rows of current cells in the matrix of current cells are enabled in response to a determination that a row control signal of the first subset of row control signals coupled to the particular row is enabled.

9. The apparatus of claim 7, wherein a particular current source in the matrix of current cells is enabled in response to a determination that a row control signal of the second subset of row control signals coupled to the particular current source and a column control signal coupled to the particular current source are enabled.

10. A method, comprising:
receiving a first plurality of input data bits, generating a first plurality of randomized bits based on the first plurality of input data bits, and providing the first plurality of randomized bits to a plurality of rows of a matrix of current cells; and
receiving a second plurality of input data bits, generating a second plurality of randomized bits based on the second plurality of input data bits, and providing the second plurality of randomized bits to a plurality of columns of the matrix of current cells, the first plurality of randomized bits and the second plurality of randomized bits being configured to enable one or more current sources in the matrix of current cells.

11. The method of claim 10, wherein said receiving a first plurality of input data bits, generating a first plurality of randomized bits based on the first plurality of input data bits, and providing the first plurality of randomized bits to a plurality of rows of a matrix of current cells comprises:
receiving the first plurality of input data bits and generating a first plurality of decoded bits based on the first plurality of input data bits; and
receiving and randomizing the first plurality of decoded bits to generate the plurality of randomized bits.

12. The method of claim 11, wherein said receiving and randomizing the first plurality of decoded bits to generate the plurality of randomized bits comprises receiving and randomizing the first plurality of decoded bits to generate a first subset of the first plurality of randomized bits and receiving and randomizing the first plurality of decoded bits to generate a second subset of the first plurality of randomized bits.

13. The method of claim 12, wherein said receiving and randomizing the first plurality of decoded bits to generate a first subset of the first plurality of randomized bits comprises randomizing the first plurality of decoded bits based on a first pseudorandom bit sequence and said receiving and randomizing the first plurality of decoded bits to generate a second subset of the first plurality of randomized bits comprises randomizing the first plurality of decoded bits based on a second pseudorandom bit sequence.

14. The method of claim 13, wherein the first pseudorandom bit sequence and the second pseudorandom bit sequence are the same.

15. The method of claim 10, wherein the first plurality of randomized bits comprises a first subset of randomized bits and a second subset of randomized bits, wherein the first subset of randomized bits correspond to a first subset of row control signals and the second subset of randomized bits correspond to a second subset of row control signals, wherein each row of current cells of the matrix of current cells is coupled to a respective row control signal of the first subset of row control signals and a respective row control signal of the second subset of row control signals; and wherein the second plurality of randomized bits correspond to column control signals, wherein each column of current cells in the matrix of current cells is coupled to a respective column control signal of the column control signals.

16. The method of claim 15, further comprising:
determining that a row control signal of the first subset of row control signals coupled to a particular row of current cells of the matrix of current cells is enabled; and
enabling a plurality of current sources in the particular row in response to determining that the row control signal of the first subset of row control signals coupled to the particular row is enabled.

17. An apparatus, comprising:
a first decoder configured to receive a first plurality of input data bits and generate one or more first control signals that are provided to one or more current cells of a first dimension of an N-dimensional matrix of current cells, the one or more first control signals being based on the first plurality of input data bits, wherein N is any integer greater than two;
a second decoder configured to receive a second plurality of input data bits and generate one or more second control signals that are provided to one or more current cells of a second dimension of the N-dimensional matrix of current cells, the one or more second control signals being based on the second plurality of input data bits; and
a third decoder configured to receive a third plurality of input data bits and generate one or more third control signals that are provided to one or more current cells of a third dimension of the N-dimensional matrix of current cells, the one or more third control signals being based on the third plurality of input data bits.

18. The apparatus of claim 17, wherein the first decoder comprises a first binary-to-thermometer decoder configured to receive the first plurality of input data bits and generate a first plurality of decoded bits, wherein the one or more first control signals are based on the first plurality of decoded bits;
wherein the second decoder comprises a second binary-to-thermometer decoder configured to receive the second plurality of input data bits and generate a second plurality of decoded bits, wherein the one or more second control signals are based on the second plurality of decoded bits; and
wherein the second decoder further comprises a third binary-to-thermometer decoder configured to receive the third plurality of input data bits and generate a third plurality of decoded bits, wherein the one or more third control signals are based on the third plurality of decoded bits.

19. The apparatus of claim 18, wherein the first decoder is further configured to randomize the first plurality of decoded bits to generate a first plurality of randomized bits, wherein the one or more first control signals are based on the first plurality of randomized bits;

wherein the second decoder is further configured to randomize the second plurality of decoded bits to generate a second plurality of randomized bits, wherein the one or more second control signals are based on the second plurality of randomized bits; and wherein the third decoder is further configured to randomize the third plurality of decoded bits to generate a third plurality of randomized bits, wherein the one or more third control signals are based on the third plurality of randomized bits.

20. An apparatus, comprising:

a first decoder configured to decode a first plurality of input data bits to generate a first plurality of decoded bits; and a first randomizer coupled to the first decoder, the first randomizer configured to randomize the first plurality of decoded bits to generate a first plurality of randomized bits, the first plurality of randomized bits being provided to one or more current cells in one or more rows of a matrix of current cells, wherein the first randomizer comprises two randomizers, a first of the two randomizers being configured to receive and randomize the first plurality of decoded bits to generate a first subset of the first plurality of randomized bits and a second of the two randomizers being configured to receive and randomize the first plurality of decoded bits to generate a second subset of the first plurality of randomized bits.

21. An apparatus, comprising:

a first decoder configured to decode a first plurality of input data bits to generate a first plurality of decoded bits; and a first randomizer coupled to the first decoder, the first randomizer configured to randomize the first plurality of decoded bits to generate a first plurality of randomized bits, the first plurality of randomized bits being provided to one or more current cells in one or more rows of a matrix of current cells, wherein the first plurality of randomized bits comprises a first subset of randomized bits and a second subset of randomized bits, wherein the first subset of randomized bits correspond to a first subset of row control signals and the second subset of randomized bits correspond to a second subset of row control signals, wherein each row of the one or more rows of current cells of the matrix of current cells is coupled to a respective row control signal of the first subset of row control signals and a respective row control signal of the second subset of row control signals, and wherein the second plurality of randomized bits correspond to column control signals, wherein each column of the one or more columns of current cells in the matrix of current cells is coupled to a respective column control signal of the column control signals.

\* \* \* \* \*